(12) United States Patent
You et al.

(10) Patent No.: US 9,449,670 B2
(45) Date of Patent: Sep. 20, 2016

(54) BIT-LINE SENSE AMPLIFIER, SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Hyung-Sik You, Hwaseong-si (KR); Jung-Bae Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 260 days.

(21) Appl. No.: 13/960,617

(22) Filed: Aug. 6, 2013

(65) Prior Publication Data

US 2014/0119091 A1 May 1, 2014

(30) Foreign Application Priority Data

Oct. 25, 2012 (KR) .................. 10-2012-0119315

(51) Int. Cl.
*G11C 11/40* (2006.01)
*G11C 11/402* (2006.01)
*G11C 11/406* (2006.01)
*G11C 11/4091* (2006.01)

(52) U.S. Cl.
CPC ............ *G11C 11/402* (2013.01); *G11C 11/406* (2013.01); *G11C 11/4091* (2013.01); *G11C 2207/002* (2013.01); *G11C 2211/4063* (2013.01); *G11C 2211/4065* (2013.01)

(58) Field of Classification Search
CPC ............ G11C 11/402; G11C 11/406; G11C 11/4091; G11C 2207/002; G11C 2211/4063; G11C 2211/4065
See application file for complete search history.

(56) References Cited

U.S. PATENT DOCUMENTS

| | | | | |
|---|---|---|---|---|
| 5,862,089 A | * | 1/1999 | Raad | G11C 11/4074 365/203 |
| 5,875,141 A | * | 2/1999 | Shirley | G11C 11/4091 365/190 |
| 5,953,275 A | * | 9/1999 | Sugibayashi et al. | 365/207 |
| 6,400,629 B1 | | 6/2002 | Barth, Jr. et al. | |
| 7,317,649 B2 | | 1/2008 | Kajigaya | |
| 7,471,558 B2 | | 12/2008 | Kajigaya | |
| 2011/0013464 A1 | | 1/2011 | Kim et al. | |
| 2011/0069570 A1 | * | 3/2011 | Katoch | 365/207 |
| 2011/0193086 A1 | * | 8/2011 | Lee et al. | 257/48 |
| 2012/0059984 A1 | * | 3/2012 | Kang et al. | 711/106 |

FOREIGN PATENT DOCUMENTS

| | | |
|---|---|---|
| JP | 2006-286090 | 10/2006 |
| JP | 2010-061760 | 3/2010 |
| KR | 10-2005-0094996 A | 9/2005 |
| KR | 10-0625817 | 9/2006 |
| KR | 10-0757936 B1 | 9/2007 |
| KR | 10-2008-0060031 A | 7/2008 |

\* cited by examiner

*Primary Examiner* — Khamdan Alrobaie
(74) *Attorney, Agent, or Firm* — Muir Patent Law, PLLC

(57) ABSTRACT

A semiconductor memory device is provided which includes a sense amplifier, a bit line connected to a plurality of memory cells of a first memory block, a complementary bit line connected to a plurality of memory cells of a second memory block, a first switch configured to connect the bit line to the sense amplifier, and a second switch configured to connect the complementary bit line to the sense amplifier. The first switch is configured to electrically separate the bit line from the sense amplifier when the second memory block performs a refresh operation.

20 Claims, 14 Drawing Sheets

FIG. 4

| LANG_D | PB2 | REF | SW1_ref | SW1 |
|--------|-----|-----|---------|-----|
| 0 | 0 | 0 | 1 | Open |
| 0 | 0 | 1 | 1 | |
| 0 | 1 | 0 | 1 | |
| 0 | 1 | 1 | 1 | |
| 1 | 0 | 0 | 1 | |
| 1 | 0 | 1 | 1 | |
| 1 | 1 | 0 | 1 | |
| 1 | 1 | 1 | 0 | Shut off |

FIG. 5

| LANG_D | PB1 | REF | SW2_ref | SW2 |
|--------|-----|-----|---------|-----|
| 0 | 0 | 0 | 1 | Open |
| 0 | 0 | 1 | 1 | |
| 0 | 1 | 0 | 1 | |
| 0 | 1 | 1 | 1 | |
| 1 | 0 | 0 | 1 | |
| 1 | 0 | 1 | 1 | |
| 1 | 1 | 0 | 1 | |
| 1 | 1 | 1 | 0 | Shut off |

FIG. 11

| LANG_D | PB2 | REF | SW1_ref | SW1 |
|---|---|---|---|---|
| 0 | 0 | 0 | 0 | Open |
| 0 | 0 | 1 | 0 | |
| 0 | 1 | 0 | 0 | |
| 0 | 1 | 1 | 0 | |
| 1 | 0 | 0 | 0 | |
| 1 | 0 | 1 | 0 | |
| 1 | 1 | 0 | 0 | |
| 1 | 1 | 1 | 1 | Shut off |

FIG. 12

| LANG_D | PB1 | REF | SW2_ref | SW2 |
|---|---|---|---|---|
| 0 | 0 | 0 | 0 | Open |
| 0 | 0 | 1 | 0 | |
| 0 | 1 | 0 | 0 | |
| 0 | 1 | 1 | 0 | |
| 1 | 0 | 0 | 0 | |
| 1 | 0 | 1 | 0 | |
| 1 | 1 | 0 | 0 | |
| 1 | 1 | 1 | 1 | Shut off |

BIT-LINE SENSE AMPLIFIER, SEMICONDUCTOR MEMORY DEVICE AND MEMORY SYSTEM INCLUDING THE SAME

CROSS-REFERENCE TO RELATED APPLICATION

This application claims priority under 35 U.S.C. §119 to Korean Patent Application No. 10-2012-0119315 filed on Oct. 25, 2012, the disclosure of which is hereby incorporated by reference in its entirety.

BACKGROUND

This disclosure relates to semiconductor memory devices, and more particularly to a semiconductor memory device including an open-bit line sense amplifier and a memory system including the semiconductor memory device.

A bit line sense amplifier of a dynamic random access memory (DRAM) senses a small difference of a signal generated on a bit line due to charge sharing between a memory cell and the bit line, and amplifies the sensed signal.

In general, the bit line of a DRAM may have an open bit-line structure or a folded bit-line structure. A DRAM having the open bit-line structure may include a bit line and a complementary bit line extending in opposite directions from a bit-line sense amplifier. In contrast, a DRAM having the folded bit-line structure may include a bit line and a complementary bit line, extending in the same direction from a bit-line sense amplifier.

Typically, a DRAM is refreshed periodically to charge/discharge a capacitor according to data stored in the DRAM.

Power consumption of a DRAM used, for example, in a mobile device is an important factor, and various efforts to reduce the power consumption have been studied. Therefore, it may help to reduce power consumption of a DRAM by reducing current consumption during a refresh operation of a DRAM.

SUMMARY

The disclosed embodiments provide a semiconductor memory device having an open bit-line structure capable of decreasing power consumption and provide a memory system including the semiconductor memory device.

In accordance with one embodiment, a semiconductor memory device includes a sense amplifier, a bit line connected to a plurality of memory cells of a first memory block, a complementary bit line connected to a plurality of memory cells of a second memory block, a first switch configured to connect the bit line to the sense amplifier, and a second switch configured to connect the complementary bit line to the sense amplifier. The first switch is configured to electrically separate the bit line from the sense amplifier when the second memory block performs a refresh operation.

In accordance with one embodiment, a semiconductor memory device includes a first memory block including a plurality of word lines, each word line connected to a respective first row of memory cells, a second memory block including a plurality of word lines, each word line connected to a respective second row of memory cells, a first bit line connected to a first column of memory cells of the first memory block and connected to a first switch, a second bit line connected to a second column of memory cells of the second memory block and connected to a second switch, and a sense amplifier connected to the first and second switch, and configured to amplify data from one bit line selected between the first bit line and the second bit line when the semiconductor memory device performs a refresh operation. The second bit line is a complementary bit line of the first bit line.

In accordance with one embodiment, a method of performing a refresh operation for a semiconductor memory device including a first switch having a first end connected to a first bit line connected to a plurality of memory cells of a first memory block and a second end connected to a bit line sense amplifier, and a second switch having a first end connected to a second bit line connected to a plurality of memory cells of a second memory block and a second end connected to the bit line sense amplifier, the second bit line being a complementary bit line of the first bit line is provided. The method includes enabling the bit line sense amplifier, and when refreshing the plurality of memory cells of the first memory block, enabling the first switch to electrically couple the first bit line to the bit line sense amplifier and disabling the second switch to electrically separate the second bit line from the bit line sense amplifier.

BRIEF DESCRIPTION OF THE DRAWINGS

Exemplary embodiments will be more clearly understood from the following detailed description taken in conjunction with the accompanying drawings. The drawings are not necessarily to scale, emphasis instead being placed upon illustrating the principles of the inventive concept. In the drawings:

FIG. 4 is an exemplary table illustrating operation of the first switch SW1 shown in FIG. 3 according to one embodiment;

FIG. 5 is an exemplary table illustrating operation of the second switch SW2 shown in FIG. 3 according to one embodiment;

FIG. 11 is an exemplary table illustrating operation of the first switch SW1 shown in FIG. 10 according to one embodiment;

FIG. 12 is an exemplary table illustrating operation of the second switch SW2 shown in FIG. 10 according to one embodiment;

DETAILED DESCRIPTION OF THE EMBODIMENTS

Figure 1:
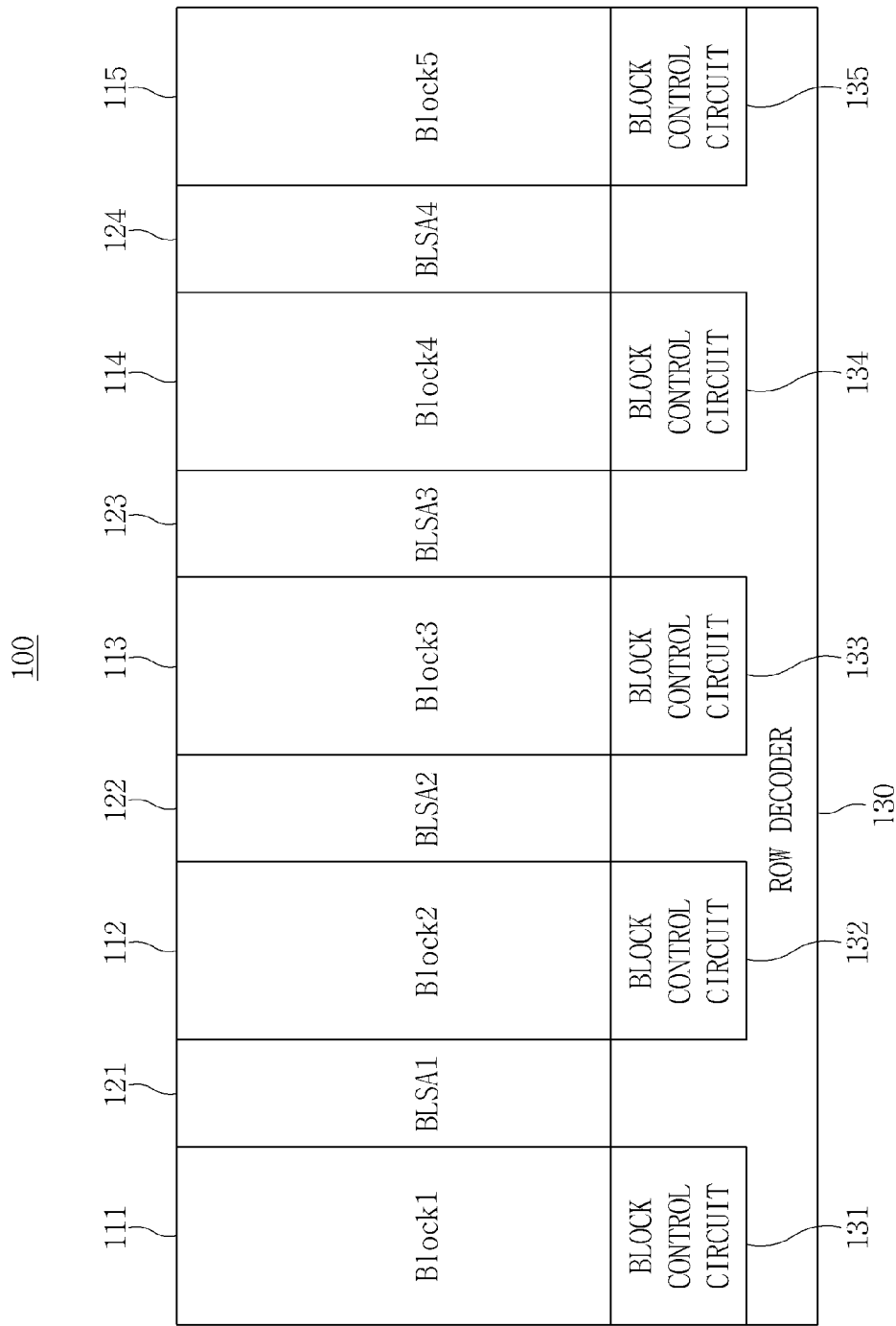
FIG. 1 is a block diagram illustrating a semiconductor memory device according to one embodiment.

Embodiments will be described below in detail with reference to the accompanying drawings. The inventive concept may be embodied in many alternate forms and should not be construed as limited to the embodiments set forth herein.

Accordingly, while the inventive concept is susceptible to various modifications and may take on various alternative forms, specific embodiments thereof are shown by way of example in the drawings and will herein be described in detail. It should be understood, however, that there is no intent to limit the inventive concept to the particular forms disclosed. On the contrary, the disclosed embodiments are to cover all modifications, equivalents, and alternatives falling within the spirit and scope of the claims.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein to describe embodiments of the disclosure is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

The embodiments will now be described more fully with reference to the accompanying drawings, in which embodiments of the inventive concept are shown.

FIG. 1 is a block diagram illustrating a semiconductor memory device 100 according to one embodiment.

Referring to FIG. 1, the semiconductor memory device 100 includes a first memory block 111, a second memory block 112, a third memory block 113, a fourth memory block 114, a fifth memory block 115, and a row decoder 130. Although five memory blocks are shown in FIG. 1, the semiconductor memory device 100 may include less or more than five memory blocks. The first to fifth memory blocks 111 to 115 may include a plurality of memory cells respectively.

The row decoder 130 may include a first block control circuit 131 that controls the first memory block 111, a second block control circuit 132 that controls the second memory block 112, a third block control circuit 133 that controls the third memory block 113, a fourth block control circuit 134 that controls the fourth memory block 114, and a fifth block control circuit 135 that controls the fifth memory block 115.

The semiconductor memory device 100 may further include a first sense amplifier block 121, a second sense amplifier block 122, a third sense amplifier block 123 and a fourth sense amplifier block 124. The first sense amplifier block 121 may be connected between the first memory block 111 and the second memory block 112. The second sense amplifier block 122 may be connected between the second memory block 112 and the third memory block 113. The third sense amplifier block 123 may be connected between the third memory block 113 and the fourth memory block 114. The fourth sense amplifier block 124 may be connected between the fourth memory block 114 and the fifth memory block 115.

Figure 2:
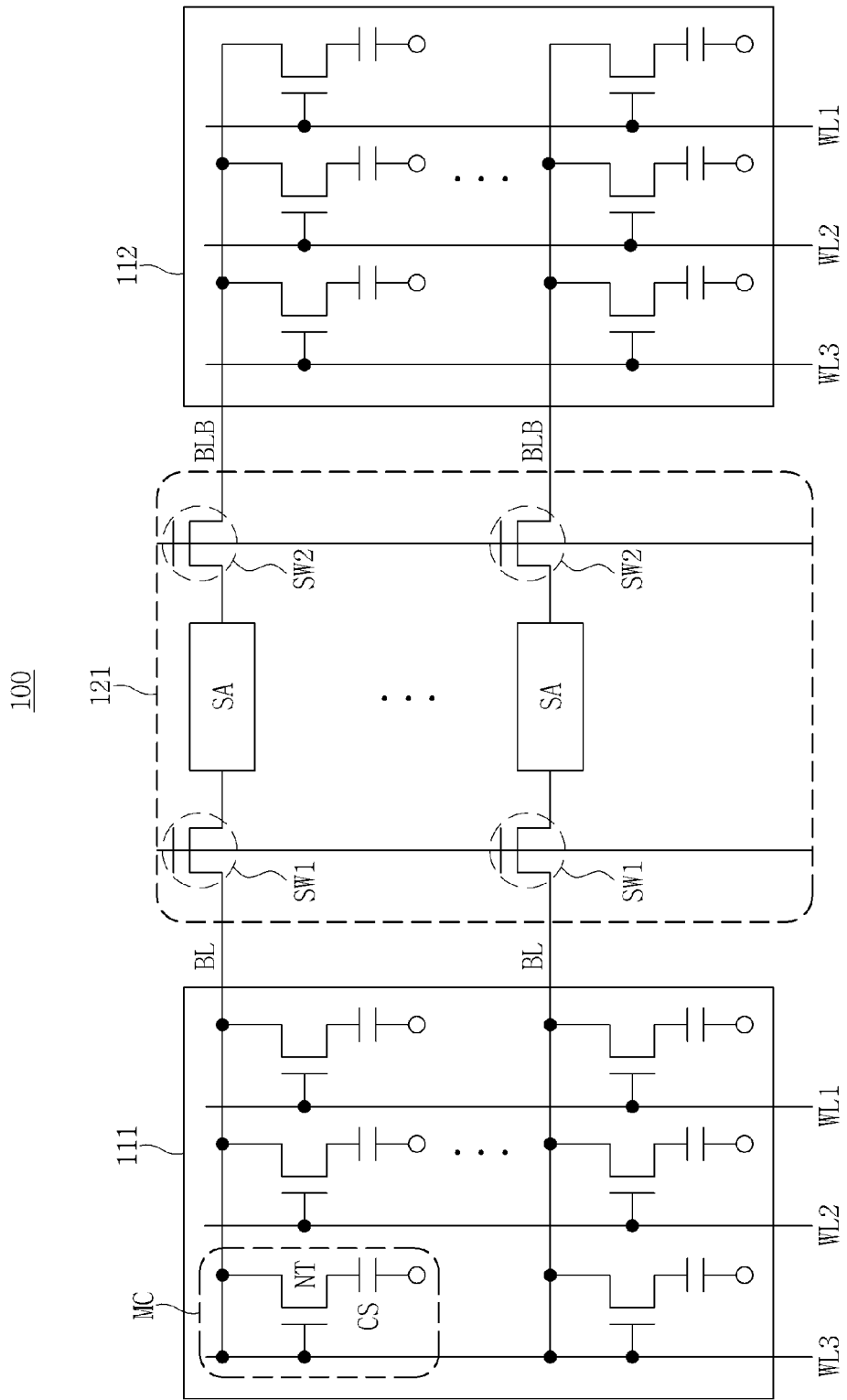
FIG. 2 is an exemplary circuit diagram showing a first memory block, a second memory block and a first sense amplifier block shown in FIG. 1 according to one embodiment.

FIG. 2 is an exemplary circuit diagram showing a first memory block, a second memory block and a first sense amplifier block shown in FIG. 1 according to one embodiment.

Hereinafter, the operations of the first to fifth memory blocks 111 to 115 and the first to fourth sense amplifier blocks 121 to 124 will be explained referring to FIGS. 1 and 2.

Referring to FIGS. 1 and 2, the first and second memory blocks 111 and 112 may have a plurality of memory cells MC. One memory cell MC may include one N-channel metal oxide semiconductor (NMOS) transistor NT and one capacitor CS.

Although structures of the third to fifth memory blocks 113 to 115 are not shown, the third to fifth memory blocks 113 and 115 may have the same structures as the first and second memory blocks 111 and 112.

The first sense amplifier block 121 may include a plurality of sense amplifiers SA. Each of the plurality of sense amplifiers SA may be connected to a bit line BL and a complementary bit line BLB through a first switch SW1 or a second switch SW2. Although structures of the second to fourth sense amplifier blocks 122 to 124 are not shown, the second to fourth sense amplifier blocks 122 to 124 may have the same structures as the first sense amplifier block 121.

The plurality of memory cells MC are connected to first to third word lines WL1 to WL3 in the first memory block 111. Although three word lines are shown in the memory block 111 of FIG. 2, the first memory block 111 may include more than three word lines.

In one embodiment, when the first memory block 111 performs a refresh operation, the second memory block 112 may be in a standby state. For example, the second switch SW2 may electrically separate the complementary bit line BLB from the sense amplifier SA. Further, when the second memory block 112 performs a refresh operation, the first memory block 111 may be in the standby state. For example, the first switch SW1 may electrically separate the bit line BL from the sense amplifier SA. A plurality of memory cells MC are connected to the bit line BL and the complementary bit line BLB.

Therefore, when a refresh operation is performed for one memory block, a current may be consumed only by either the bit line BL or the complementary bit line BLB. Therefore, when the bit line BL or the complementary bit line BLB connected to a memory block in which the refresh operation is not performing is electrically separated from the sense amplifier SA, current consumption may be decreased.

The operation of the first and second switch SW1 and SW2 will be described in detail referring to FIG. 3.

Figure 3:
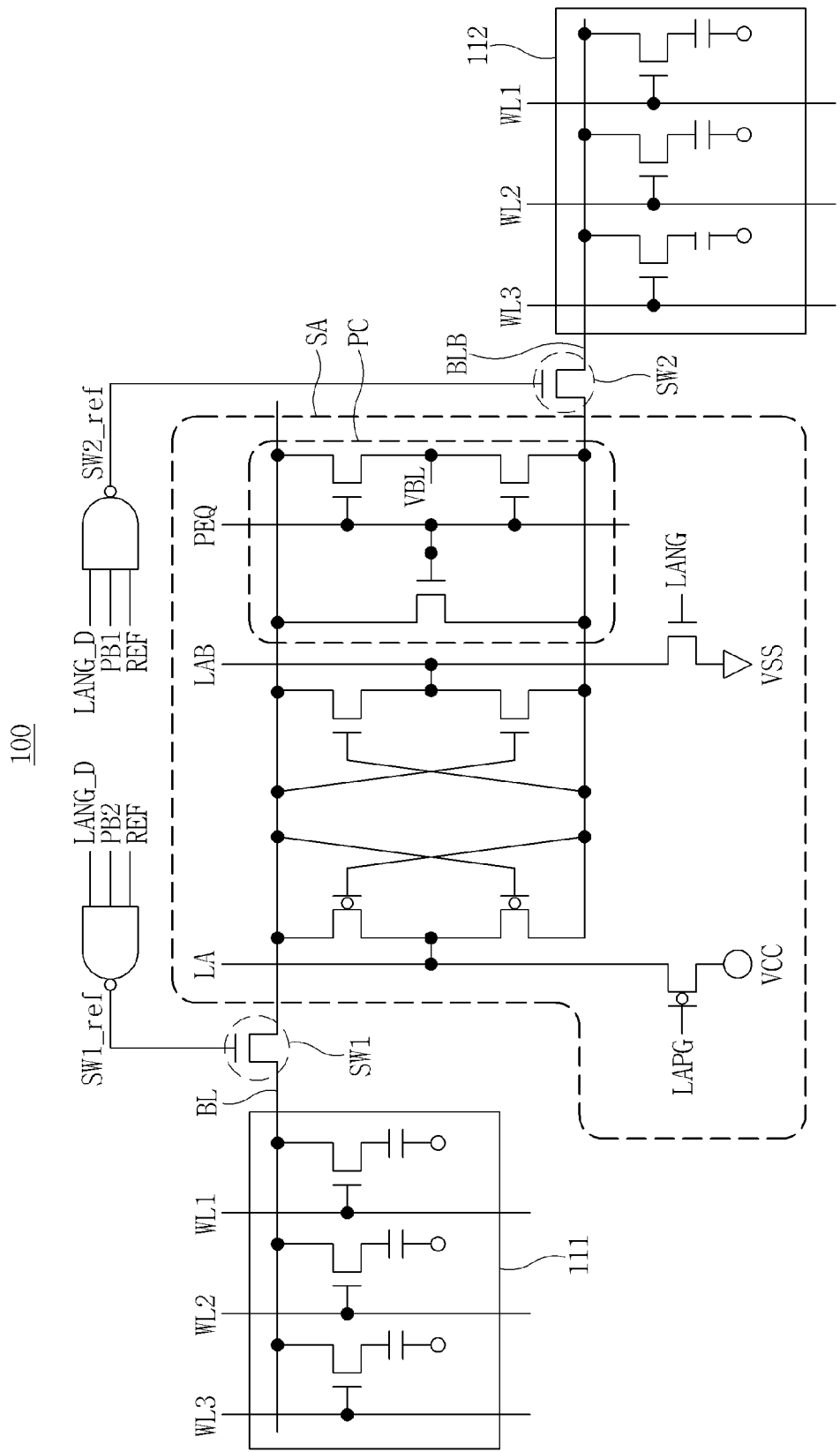
FIG. 3 is an exemplary circuit diagram showing the first memory block, the second memory block and a sense amplifier included in the first sense amplifier block shown in FIG. 2 according to one embodiment.

FIG. 3 is an exemplary circuit diagram showing the first memory block 111, the second memory block 112 and a sense amplifier SA included in the first sense amplifier block 121 shown in FIG. 2 according to one embodiment.

Referring to FIG. 3, the semiconductor memory device 100 may have an open bit-line structure. Therefore, the sense amplifier SA may be connected between the first memory block 111 and the second memory block 112. For example, a bit line BL is connected to the first memory block 111 and the complementary bit line BLB is connected to the second memory block 112.

In one embodiment, the first switch SW1 is connected between the first memory block 111 and the bit line BL, and the second switch SW2 is connected between the second memory block 112 and the complementary bit line BLB. The sense amplifier SA may include a pre-charge block PC that pre-charges the bit line BL and the complementary bit line BLB to a pre-charge voltage VBL. Further, when sense amplifier enabling signals LANG and LAPG are enabled and data from the first memory block 111 or the second memory block 112 is transmitted to the sense amplifier SA through the bit line BL or the complementary bit line BLB, the sense amplifier SA senses and amplifies the data.

In one embodiment, the first switch SW1 may electrically separate the bit line BL from the sense amplifier SA when the second memory block 112 performs a refresh operation.

In contrast, the second switch SW2 may electrically separate the complementary bit line BLB from the sense amplifier SA when the first memory block 111 performs a refresh operation.

More specifically, the first switch SW1 may be controlled by a control signal SW1_ref. The control signal SW1_ref may be generated by performing a NAND operation on signals LANG_D, PB2 and REF. The operation of the signals driving the first switch SW1 is illustrated in the table of FIG. 4.

Further, the second switch SW2 may be controlled by a control signal SW2_ref. The control signal SW2_ref of the second switch SW2 may be generated by performing a NAND operation on signals LANG_D, PB1 and REF. The operation of the signals driving the second switch SW2 is illustrated in the table of FIG. 5.

The sense amplifier enabling signals LANG and LAPG are signals that apply a ground voltage VSS and a power supply voltage VCC to the bit line BL or the complementary bit line BLB. The signal LANG_D may be generated by delaying the signal LANG. For example, LANG_D may be replaced by LANG. In example embodiments, LANG_D is used because the voltage difference between the bit line BL and the complementary bit line BLB should be guaranteed when the memory cells MC are sensed.

The signal REF is a signal that detects a refresh signal in the first to fifth memory blocks 111 to 115. The signal REF may be generated in synchronization with a row address strobe signal/RAS that is applied to the semiconductor memory device 100. The signal PB1 is a signal that informs that one of the word lines of the first memory block 111 is activated, and PB2 is a signal that informs that one of the word lines of the second memory block 112 is activated.

The operation of the first and second switch SW1 and SW2 will be described in detail referring to FIG. 6.

In FIGS. 2 and 3, the first and second switch SW1 and SW2 are implemented using NMOS transistors, but the first and second switch SW1 and SW2 may be implemented using PMOS transistors. The operation of the first and second switch SW1 and SW2 including PMOS transistors will be described in detail referring to FIGS. 9 to 12.

FIG. 4 is an exemplary table illustrating operation of the first switch SW1 shown in FIG. 3 according to one embodiment.

Referring to FIGS. 3 and 4, the first switch SW1 may be cut off only when the second memory block 112 performs refresh operation. For example, the first switch SW1 may be cut off only when PB2 which is an activation signal of word lines of the second memory block 112, REF which is a refresh signal, and LANG_D which is a signal that applies the ground voltage VSS to the sense amplifier SA are activated.

FIG. 5 is an exemplary table illustrating operation of the second switch SW2 shown in FIG. 3 according to one embodiment.

Referring to FIGS. 3 and 5, the second switch SW2 may be cut off only when the first memory block 111 performs a refresh operation. For example, the second switch SW2 may be cut off only when PB1 which is an activation signal of word lines of the first memory block 111, REF which is a refresh signal, and LANG_D which is a signal that applies the ground voltage VSS to the sense amplifier SA are activated.

Figure 6:
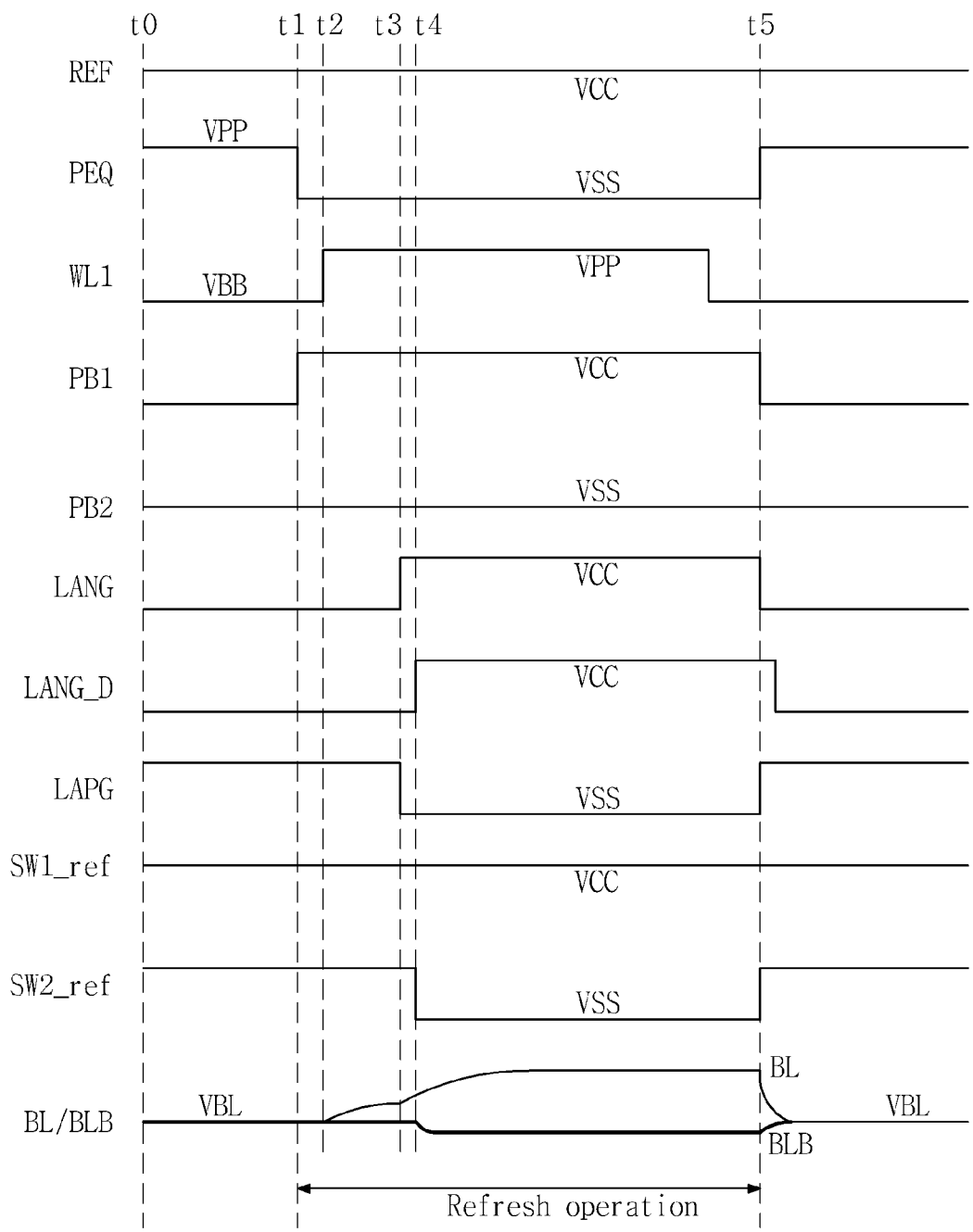
FIG. 6 is an exemplary timing diagram illustrating operation of the second switch SW2 shown in FIG. 3 according to one embodiment.

FIG. 6 is an exemplary timing diagram illustrating operation of the second switch SW2 shown in FIG. 3 according to one embodiment.

Referring to FIGS. 1 to 4 and 6, the refresh sensing signal REF maintains an activated state after t0.

During t0 to t1, PEQ that pre-charges the bit line BL and the complementary bit line BLB is activated, and the pre-charge block PC pre-charges the bit line BL and the complementary bit line BLB to the pre-charge voltage VBL. A voltage level of the pre-charge voltage VBL is typically VCC/2.

At t1, PB1, which is an activation signal of word lines of the first memory block 111, is activated. At t2, WL1, which is an activation signal of the first word line WL1 of the first memory block 111, is activated. For example, WL1 may maintain a back bias voltage VBB level (e.g., a negative voltage) when deactivated, and maintain a high voltage VPP level (e.g., greater than VCC) when activated. From t2 to t3, a charge of the bit line BL and a charge of a capacitor CS of the selected memory cell are shared with each other (for example, a charge sharing operation).

At t3, LAPG, a sense amplifier enabling signal that controls supplying of the supply voltage VCC to the bit line BL or the complementary bit line BLB, is activated. Further, at t3, LANG, a sense amplifier enabling signal that controls supplying of the ground voltage VSS to the bit line BL or the complementary bit line BLB, is activated. LANG_D is generated by delaying LANG by an interval between t4 and t3. From t3 to t5, the sense amplifier SA senses and amplifies data transmitted from the first memory block 111 through the bit line BL. At t5, all the signals return to a state before t0.

From t4 to t5, when LANG_D, PB1 and REF are all activated, SW2_ref maintains a low state, and the second switch SW2 is cut off. When the second switch SW2 is cut off, the complementary bit line BLB and the sense amplifier are electrically separated. The voltage of the complementary bit line BLB may have a voltage level that is equal to or slightly less than the pre-charge voltage VBL, because the complementary bit line BLB is pre-charged by the pre-charge block PC. As such, the change of the voltage level of the complementary bit line BLB may be small. Therefore, during the refresh operation, the current consumption through the complementary bit line BLB may be small. In one embodiment, as shown in FIG. 6, the difference of voltage between the bit line BL and the complementary bit line BLB during refresh operation is lower than in the prior art systems. For example, the voltage difference ΔV between the pre-charge voltage VBL and the bit line BL voltage is asymmetrical compared to the voltage difference ΔV between the pre-charge voltage VBL and the complementary bit line BLB voltage (e.g., it is greater).

Figure 7:
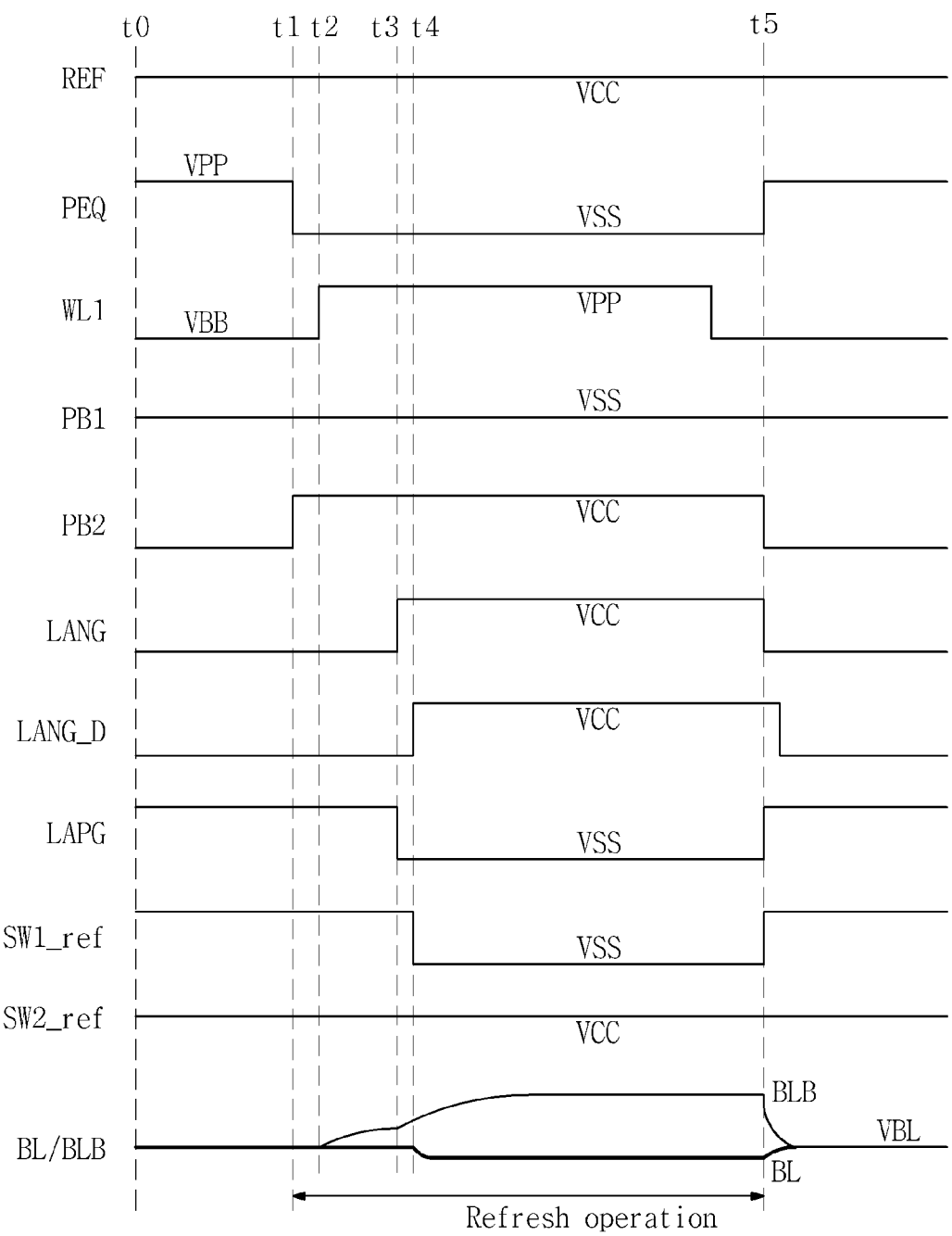
FIG. 7 is an exemplary timing diagram illustrating operation of the first switch SW1 shown in FIG. 3 according to one embodiment.

FIG. 7 is an exemplary timing diagram illustrating operation of the first switch SW1 shown in FIG. 3 according to one embodiment.

Referring to FIGS. 1 to 3, 5 and 7, the refresh sensing signal REF maintains an activated state after t0.

From t0 to t1, PEQ that pre-charges the bit line BL and the complementary bit line BLB is activated, and the pre-charge block PC pre-charges the bit line BL and the complementary bit line BLB to the pre-charge voltage VBL.

At t1, PB2, which is an activation signal of word lines of the second memory block 112, is activated. At t2, WL1, which is an activation signal of the first word line WL1 of the second memory block 112, is activated. From t2 to t3, a charge of the complementary bit line BLB and a charge of a capacitor CS of the selected memory cell are shared with each other (for example, a charge sharing operation).

At t3, LAPG, a sense amplifier enabling signal that controls supplying of the supply voltage VDD to the bit line BL or the complementary bit line BLB, is activated. Further, at t3, LANG, a sense amplifier enabling signal that controls supplying of the ground voltage VSS to the bit line BL or the complementary bit line BLB, is activated. LANG_D is generated by delaying LANG by an interval between t4 and t3. From t4 to t5, the sense amplifier SA senses and amplifies data transmitted from the second memory block 112 through the complementary bit line BLB. At t5, all the signals return to a state before t0.

From t4 to t5, when LANG_D, PB2 and REF are all activated, SW2_ref maintains a low state, and the first switch SW1 is cut off. When the first switch SW1 is cut off, the bit line BL and the sense amplifier are electrically separated. The voltage of the bit line BL may have a voltage level that is equal to or slightly less than the pre-charge voltage VBL, because the bit line BL is pre-charged by the pre-charge block PC. That is, the change of the voltage level of the bit line BL may be small. Therefore, during the refresh operation, the current consumption through the bit line BL may be reduced.

Figure 8:
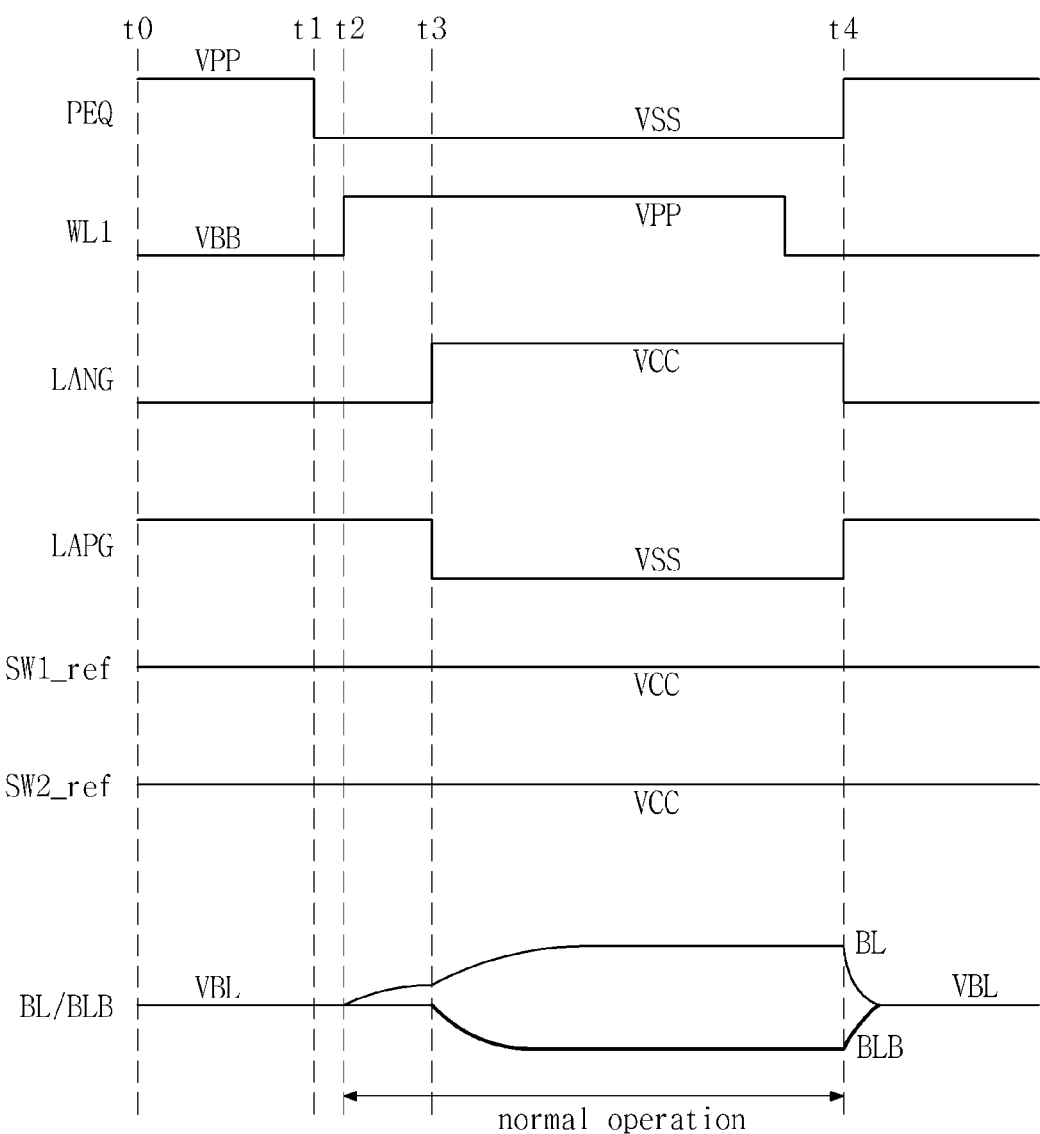
FIG. 8 is a timing diagram illustrating operation of the sense amplifier SA shown in FIG. 3 when the first memory block and the second memory block operate in a normal mode.

FIG. 8 is a timing diagram illustrating operation of the sense amplifier SA shown in FIG. 3 when the first memory block 111 and the second memory block 112 operate in a normal mode.

Referring to FIGS. 1 to 3 and 8, from t0 to t1, the pre-charge block PC pre-charges the bit line BL or the complementary bit line BLB to a pre-charge voltage VBL. At t2, WL1, which is an activation signal of the first word line WL1 of the first memory block 111, is activated. At t3, LAPG, a sense amplifier enabling signal that controls supplying of the supply voltage VCC to the bit line BL or the complementary bit line BLB, is activated. Further, at t3, LANG, a sense amplifier enabling signal that controls supplying of the ground voltage VSS to the bit line BL or the complementary bit line BLB, is activated. From t3 to t4, the sense amplifier SA senses and amplifies data transmitted from the first memory block 111 through the bit line BL. Further, from t3 to t4, the sense amplifier SA senses data transmitted from the second memory block 112 through the complementary bit line BLB. At t4, all the signals return to a state before t0.

The voltage level of the complementary bit line BLB in FIG. 6 and the voltage level of the bit line BL in FIG. 7 may have a voltage level similar to the pre-charge voltage VBL. On the other hand, the voltage level of the complementary bit line BLB in FIG. 8 may have a voltage level similar to the ground voltage VSS. As a result, as shown in FIG. 8, the voltage difference ΔV between the pre-charge voltage VBL and the bit line BL voltage is symmetrical compared to the voltage difference ΔV between the pre-charge voltage VBL and the complementary bit line BLB voltage (e.g., it is substantially the same).

Figure 9:
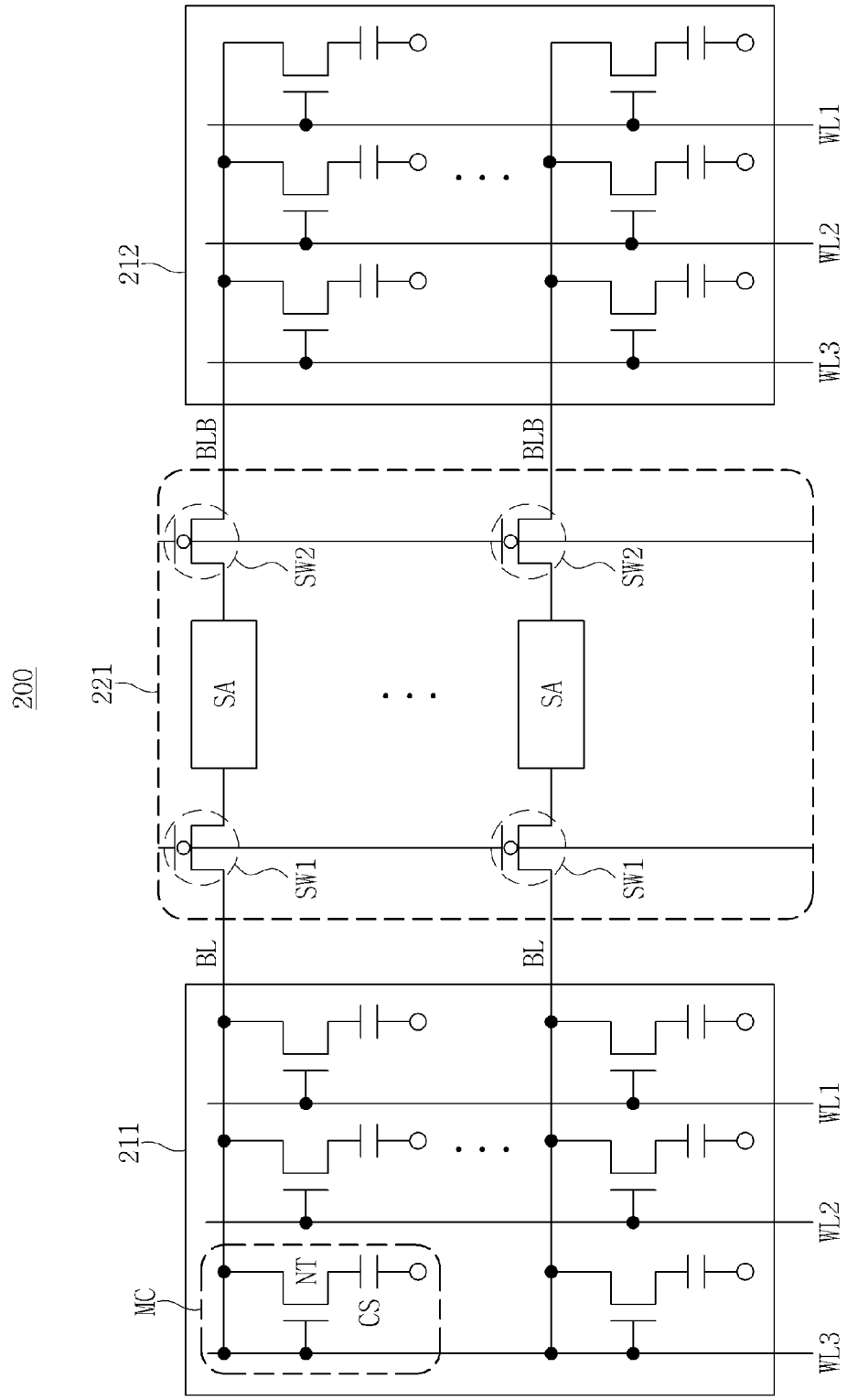
FIG. 9 is an exemplary block diagram illustrating a semiconductor memory device according to another embodiment.

FIG. 9 is an exemplary block diagram illustrating a semiconductor memory device 200 according to another embodiment.

The semiconductor memory device 200 shown in FIG. 9 may have a similar circuit structure to the semiconductor memory device 100 shown in FIG. 2, except for the first and second switches SW1 and SW2 and a control circuit, that is an AND gate, that controls the first and second switches SW1 and SW2. The semiconductor memory device 200 may include the first and second switches SW1 and SW2 implemented using PMOS transistors.

Referring to FIG. 9, the first and second memory blocks 211 and 212 may have a plurality of memory cells MC. The first sense amplifier block 221 may include a plurality of sense amplifiers SA. Each of the plurality of sense amplifiers SA may be connected to a bit line BL and a complementary bit line BLB through a first switch SW1 or a second switch SW2.

The plurality of memory cells MC are connected to a first to third word lines WL1 to WL3 in the first memory block 211. Although three word lines are shown in the memory block 211 of FIG. 9, the first memory block 211 may include more than three word lines.

In one embodiment, when the first memory block 211 performs a refresh operation, the second memory block 212 may be in a standby state. For example, the second switch SW2 may electrically separate the complementary bit line BLB from the sense amplifier SA. Further, when the second memory block 212 performs a refresh operation, the first memory block 211 may be in the standby state. For example, the first switch SW1 may electrically separate the bit line BL from the sense amplifier SA. A plurality of memory cells MC are connected to the bit line BL and the complementary bit line BLB. Therefore, when a refresh operation is performed for one memory block, a current may be consumed only by either the bit line BL or the complementary bit line BLB. Therefore, when the bit line BL or the complementary bit line BLB connected to a memory block in which the refresh operation is not performing electrically separated from the sense amplifier SA, current consumption may be decreased.

The operation of the first and second switch SW1 and SW2 will be described in detail referring to FIG. 10.

Figure 10:
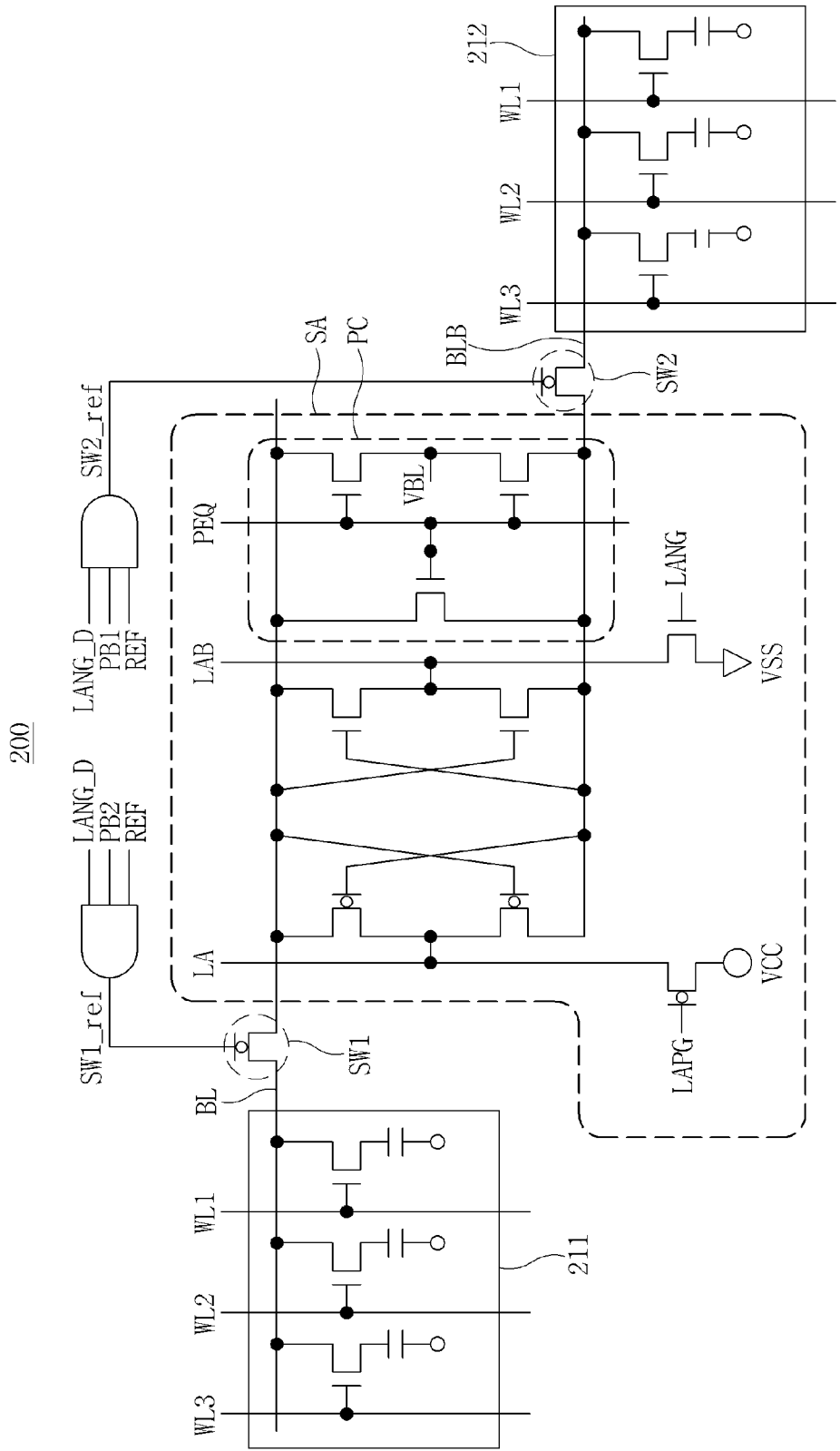
FIG. 10 is an exemplary circuit diagram showing a first memory block, a second memory block and a first sense amplifier block shown in FIG. 9 according to one embodiment.

FIG. 10 is an exemplary circuit diagram showing the first memory block 211, the second memory block 212 and a sense amplifier SA included in the first sense amplifier block 221 shown in FIG. 9 according to one embodiment.

Referring to FIG. 10, the semiconductor memory device 200 may have an open bit-line structure. Therefore, the sense amplifier SA may be connected between the first memory block 211 and the second memory block 212. For example, when a bit line BL is connected to the first memory block 211 the complementary bit line BLB is connected to the second memory block 212.

In one embodiment, the first switch SW1 is connected between the first memory block 211 and the bit line BL, and the second switch SW2 is connected between the second memory block 212 and the complementary bit line BLB. The sense amplifier SA may include a pre-charge block PC that pre-charges the bit line BL and the complementary bit line BLB to a pre-charge voltage VBL. Further, when sense amplifier enabling signals LANG and LAPG are enabled and data from the first memory block 211 or the second memory block 212 is transmitted to the sense amplifier SA through the bit line BL or the complementary bit line BLB, the sense amplifier SA senses and amplifies the data.

In one embodiment, the first switch SW1 may electrically separate the bit line BL from the sense amplifier SA when the second memory block 212 performs a refresh operation. In contrast, the second switch SW2 may electrically separate the complementary bit line BLB from the sense amplifier SA when the first memory block 211 performs a refresh operation.

More specifically, the first switch SW1 may be controlled by a control signal SW1_ref. The control signal SW1_ref of the first switch SW1 may be generated by performing an AND operation on signals LANG_D, PB2 and REF. The operation of the signals driving the first switch SW1 is illustrated in the table of FIG. 10.

Further, the second switch SW2 may be controlled by a control signal SW2_ref. The control signal SW2_ref of the second switch SW2 may be generated by performing an AND operation on signals LANG_D, PB1 and REF. The operation of the signals driving the second switch SW2 is illustrated in the table of FIG. 11.

FIG. 11 is an exemplary table illustrating operation of the first switch SW1 shown in FIG. 10 according to one embodiment.

Referring to FIGS. 9 to 11, the first switch SW1 may be cut off only when the second memory block 212 performs a refresh operation. For example, the first switch SW1 may be cut off only when PB2 which is an activation signal of word lines of the second memory block 212, REF which is a refresh signal, and LANG_D which is a signal that applies the ground voltage VSS to the sense amplifier SA are activated.

FIG. 12 is an exemplary table illustrating operation of the second switch SW2 shown in FIG. 10 according to one embodiment.

Referring to FIGS. 9, 10 and 12, the second switch SW2 may be cut off only when the first memory block 211 performs refresh operation. For example, the second switch SW2 may be cut off only when PB1 which is an activation signal of word lines of the first memory block 211, REF which is a refresh signal, and LANG_D which is a signal that applies the ground voltage VSS to the sense amplifier SA are activated.

Figure 13:
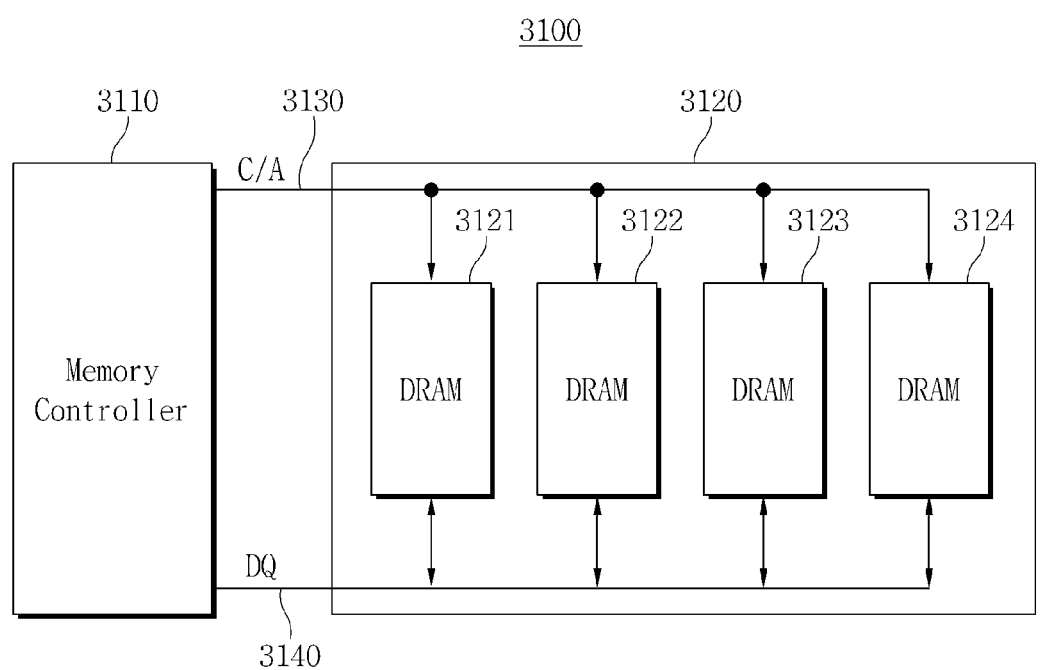
FIG. 13 is an exemplary block diagram illustrating a memory system including a semiconductor memory device shown in FIG. 1 or FIG. 9 according to one embodiment.

FIG. 13 is an exemplary block diagram illustrating a memory system 3100 including a semiconductor memory device 100 or 200 shown in FIG. 1 or FIG. 9 according to one embodiment.

Referring to FIG. 13, the memory system may include a memory controller 3110 and a memory module 3120.

The semiconductor memory device 100 shown in FIG. 1 may be implemented with a DRAM.

The memory module 3120 including four DRAMs is shown in FIG. 13, but the memory module 3120 may include less or more than four DRAMs. The first to fourth DRAMs 3121 to 3124 may be mounted on both sides of a substrate.

The memory controller 3110 may generate a command/address signal C/A and data DQ. The memory module 3120 may operate in response to the C/A and the data DQ. The command/address signal C/A may be packet data in which a command signal and an address signal are combined in a packet form.

The command/address bus 3130 may have a fly-by structure, and electrically connect the first to fourth DRAMs 3121 to 3124. Data DQ may be transmitted or received among the memory controller 2510 and the first to fourth DRAMs 3121 to 3124 included in the memory module 3120.

Figure 14:
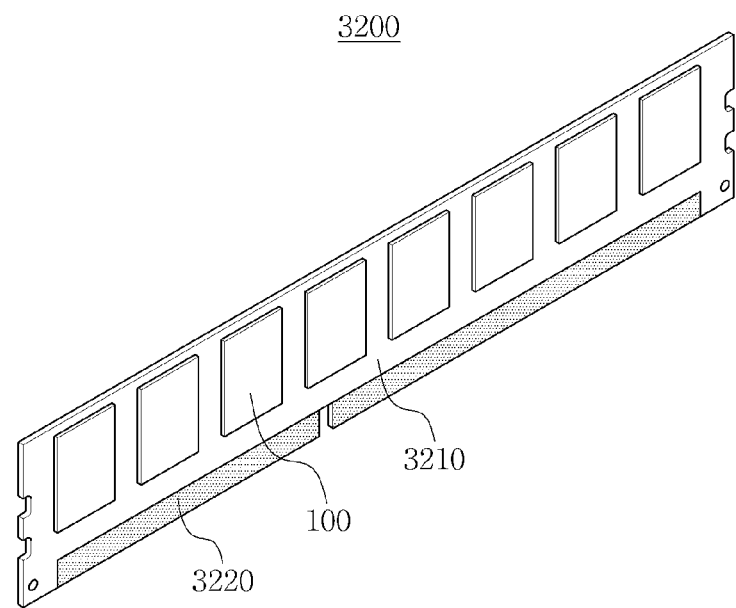
FIGS. 14 to 16 are exemplary diagrams illustrating memory modules including a semiconductor memory device shown in FIG. 1 or FIG. 9 according to embodiments.
Figure 15:
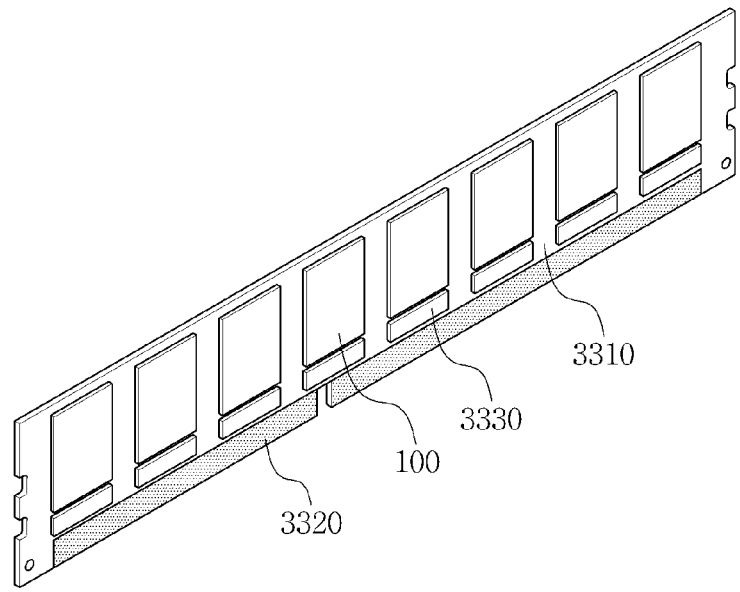
Figure 16:
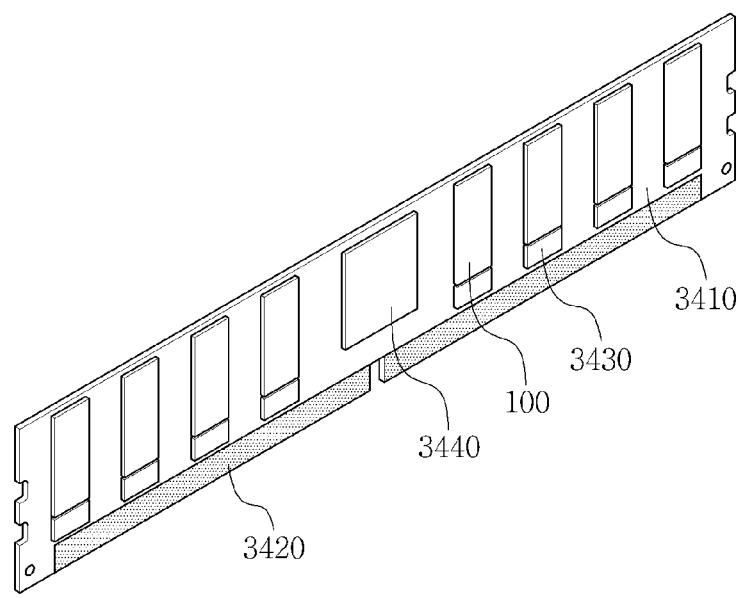

FIGS. 14 to 16 are exemplary diagrams illustrating memory modules 3200, 3300 and 3400 including a semiconductor memory device shown in FIG. 1 or FIG. 9 according to embodiments.

Referring to FIG. 14, the memory module 3200 may include a printed circuit board (PCB) 3210, a plurality of semiconductor memory devices 100, and a connector 3220. The plurality of semiconductor memory devices 100 may be bonded to top and bottom surfaces of the PCB 3110. The connector 3220 may be electrically connected to the plurality of semiconductor memory devices 100 through conductive lines (not shown). Also, the connector 3220 may be connected to a slot of an external host.

Referring to FIG. 15, the memory module 3300 may include a PCB 3310, a plurality of semiconductor memory devices 100, a connector 3320, and a plurality of buffers 3330. Each of the plurality of buffers 3330 may be disposed between the corresponding one of the semiconductor memory devices 100 and the connector 3320.

The plurality of buffers 3330 connected to the plurality of semiconductor memory devices 100 may be provided on top and bottom surfaces of the PCB 3310. The semiconductor memory devices 100 and the buffers 3330 formed on the top and bottom surfaces of the PCB 3310 may be connected through a plurality of via holes.

Referring to FIG. 16, the memory module 3400 may include a PCB 3410, a plurality of semiconductor memory devices 100, a connector 3420, a plurality of buffers 3430, and a controller 3440.

The plurality of buffers 3430 connected to the plurality of semiconductor memory devices 100 may be provided on top and bottom surfaces of the PCB 3410. The semiconductor memory devices 100 and the buffers 3440 formed on the top and bottom surfaces of the PCB 3410 may be connected through a plurality of via holes. The controller 3440 transmits control signals to the plurality of semiconductor memory devices 100, and transmits or receives data to and from the plurality of semiconductor memory devices 100.

Figure 17:
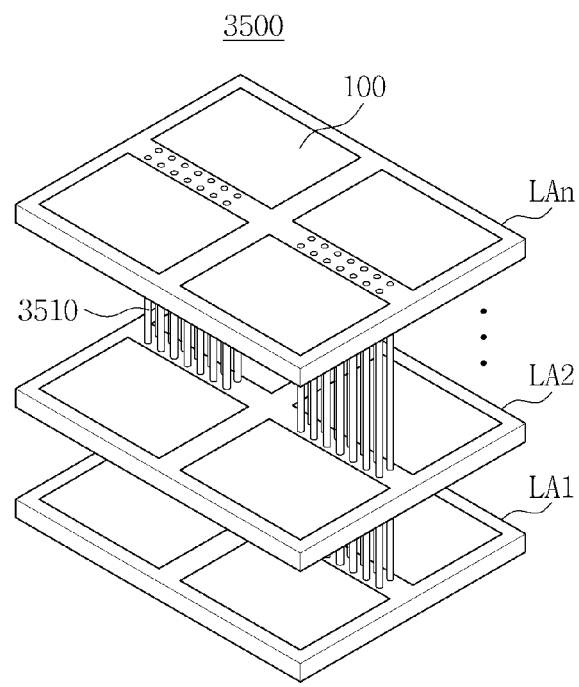
FIG. 17 is an exemplary perspective view of a semiconductor device having a stack structure including a plurality of semiconductor layers according to one embodiment.

FIG. 17 is a simplified perspective view of a stack semiconductor device 3500 including a plurality of semiconductor layers according to one embodiment. In the memory modules 3200, 3300, and 3400 of FIGS. 14 through 16, each of the semiconductor memory devices 100 may include a plurality of semiconductor layers LA1 to LAn.

Referring to FIG. 17, in the stack semiconductor device 3500, the plurality of stacked semiconductor layers LA1 to LAn may be connected to one another through through-substrate vias (e.g., through-silicon vias TSVs) 3510.

Figure 18:
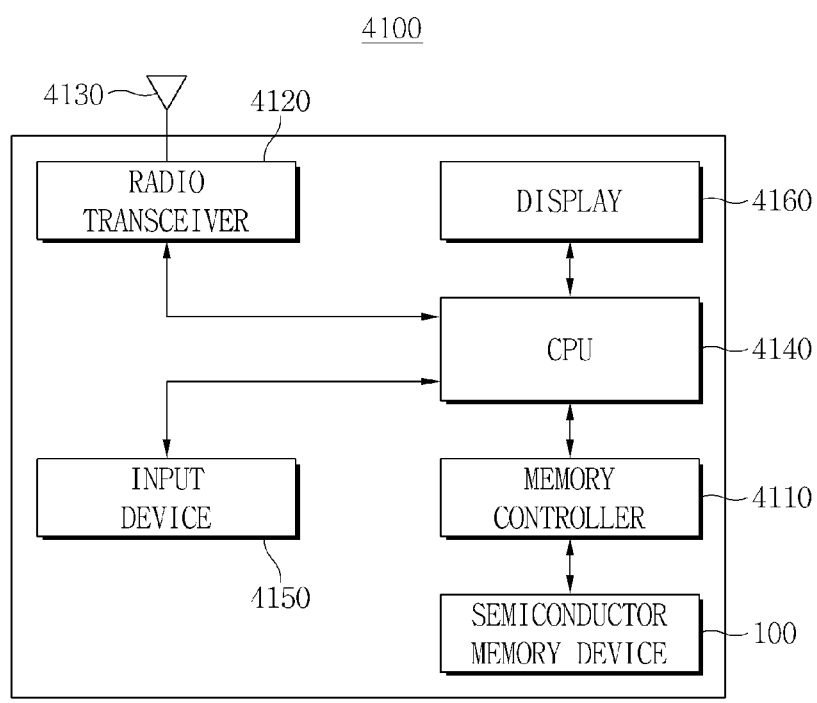
FIG. 18 is an exemplary block diagram of a computer system including a semiconductor memory device shown in FIG. 1 or FIG. 9 according to one embodiment.

FIG. 18 is an exemplary block diagram of a computer system 4100 including a semiconductor memory device 100 or 200 shown in FIG. 1 or FIG. 9 according to one embodiment.

Referring to FIG. 18, the computer system 4100 may include semiconductor memory devices 100, a memory controller 4110 that controls the semiconductor memory devices 100, a radio transceiver 4120, an antenna 4130, a central processing unit 4140, an input device 4150 and a display 4160.

The radio transceiver 4120 may transmit or receive a radio signal through the antenna 4130. Further, the radio transceiver 4120 may convert the radio signal received from the antenna 4130 into a signal that can be processed in the central processing unit 4140.

The central processing unit 4140 may process the signal output from the radio transceiver 4120 and transmit the processed signal to the display 4160. Further, the radio transceiver 4120 may convert the signal output from the central processing unit 4140 to a radio signal and output the converted signal to external devices.

The input device 4150 is a device that can input a control signal for controlling the operation of the central processing unit 4140 or data to be processed by the central processing unit 4140, and may be implemented as a pointing device such as a touch pad and a computer mouse, a keypad or a keyboard.

Although the semiconductor memory devices 100 of FIG. 1 are shown in the computer system 4100 of FIG. 18, the computer system 4100 may include the semiconductor memory devices 200 of FIG. 9.

Figure 19:
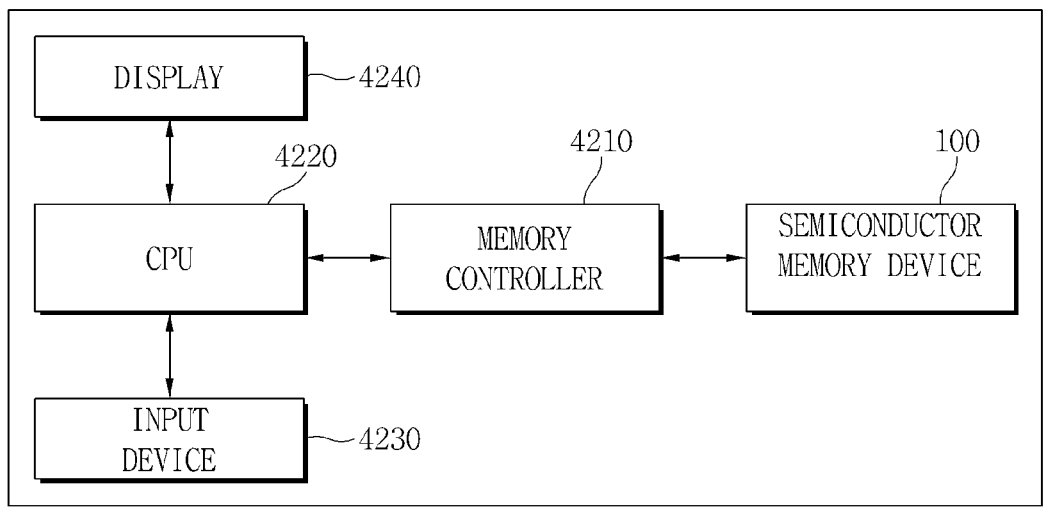
FIG. 19 is an exemplary block diagram of a computer system including a semiconductor memory device shown in FIG. 1 or FIG. 9 according to another embodiment.

FIG. 19 is an exemplary block diagram of a computer system 4200 including a semiconductor memory device 100 or 200 shown in FIG. 1 or FIG. 9 according to another embodiment.

The computer system 4200 of FIG. 19 may be implemented, for example, as a personal computer (PC), a network server, a tablet PC, a net-book, an e-reader, a personal digital assistant, a portable multimedia player (PMP), an MP3 player or an MP4 player.

In one embodiment, the computer system 4200 may include a semiconductor memory device 100, a memory controller 4210 that controls a data processing operation of the semiconductor memory device 100, a central processing unit 4220, an input device 4230 and a display 4240.

The central processing unit 4220 may display data stored in the semiconductor memory device 100 through the display 4240 according to data received through the input device 4230. For example, the input device 4230 may be implemented as a pointing device such as a touch pad and a computer mouse, a keypad or a keyboard. The central processing unit 4220 may control the overall operation of the computer system 4200, and may control the operation of the memory controller 4210.

According to certain embodiments, the memory controller 4210 that can control the operation of the semiconductor memory device 100 may be implemented as a part of the central processing unit 4220, or as a separate chip from the central processing unit 4220.

Although the semiconductor memory devices 100 of FIG. 1 are shown in the computer system 4200 of FIG. 19, the computer system 4200 may include the semiconductor memory devices 200 of FIG. 9.

Figure 20:
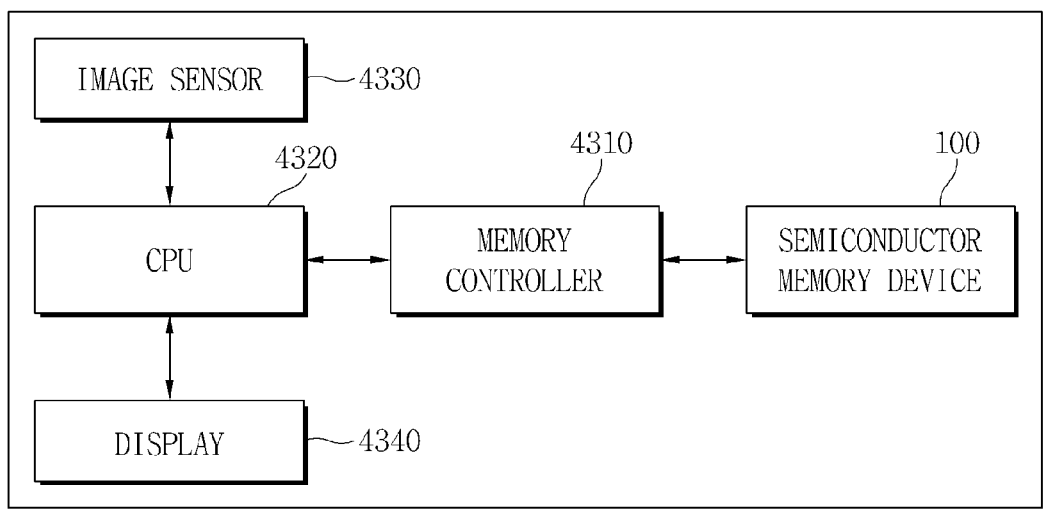
FIG. 20 is an exemplary block diagram of a computer system including a semiconductor memory device shown in FIG. 1 or FIG. 9 according to still another embodiment.

FIG. 20 is an exemplary block diagram of a computer system 4300 including a semiconductor memory device 100 or 200 shown in FIG. 1 or FIG. 9 according to still another embodiment.

The computer system 4300 of FIG. 20 may be implemented as an image processing device such as a digital camera, a mobile phone, a smart phone or a tablet including a digital camera.

The computer system 4300 may include a semiconductor memory device 100, a memory controller 4310 that controls data processing operation including a write operation and read operation of the semiconductor memory device 100. Further, the computer system 4300 may include a central processing unit 4320, an image sensor 4330 and a display 4340.

The image sensor 4330 of the computer system 4300 converts an optical image to digital signals and transmits the converted digital signals to the central processing unit 4320 or the memory controller 4310. According to the control of the central processing unit 4320, the converted digital signals may be displayed through the display 4340 or stored in the semiconductor memory device 100 through the memory controller 4310.

Further, the data stored in the semiconductor memory device 100 may be displayed through the display 4340 according to the control of the central processing unit 4320 or the memory controller 4310. According to embodiments, the memory controller 4310 that can control the operation of the semiconductor memory device 100 may be implemented as a part of the central processing unit 4320, or as a separate chip from the central processing unit 4320.

Although the semiconductor memory device 100 of FIG. 1 is shown in the computer system 4300 of FIG. 20, the computer system 430 may include the semiconductor memory devices 200 of FIG. 9.

The disclosed embodiments may be applied to a semiconductor device and a memory system including the same.

The foregoing is illustrative of embodiments and is not to be construed as limiting thereof. Although a few embodiments have been described, those skilled in the art will readily appreciate that many modifications are possible without materially departing from the novel teachings and advantages of the disclosed embodiments. Accordingly, all such modifications are intended to be included within the scope of this inventive concept as defined in the claims.

What is claimed is:

1. A semiconductor memory device, comprising:
a sense amplifier;
a bit line connected to a plurality of memory cells of a first memory block;
a complementary bit line connected to a plurality of memory cells of a second memory block;
word lines connected to the plurality of memory cells of the first and second memory blocks;
a first switch configured to connect the bit line to the sense amplifier; and
a second switch configured to connect the complementary bit line to the sense amplifier,
wherein the semiconductor memory device is configured such that, when the complementary bit line is electrically connected to the sense amplifier:
the first switch electrically separates the bit line from the sense amplifier such that the bit line is not electrically connected to the sense amplifier,
a first memory cell among the plurality of memory cells connected to the complementary bit line activates in response to a first word line signal applied to a first word line connected to the first memory cell, and
the second switch remains in an on state while the first word line remains activated.

2. The semiconductor memory device of claim 1, wherein a selected memory cell of the first memory block is configured to transmit data to the sense amplifier through the bit line when the first switch is on.

3. The semiconductor memory device of claim 1, wherein a selected memory cell of the second memory block is configured to transmit data to the sense amplifier through the complementary bit line when the second switch is on.

4. The semiconductor memory device of claim 1, wherein the sense amplifier is arranged between the first memory block and the second memory block.

5. The semiconductor memory device of claim 1, wherein each of the first switch and the second switch includes an NMOS transistor or a PMOS transistor.

6. The semiconductor memory device of claim 1, wherein the first switch, the second switch and the sense amplifier are configured to be connected in an open bit-line structure.

7. The semiconductor memory device of claim 1, wherein the bit line and the complementary bit line are configured to have, during a refresh operation, different voltage difference compared to a precharge voltage.

8. The semiconductor memory device of claim 1, further comprising:
a control circuit configured to generate first and second switch control signals that control the first and second switches, respectively,
wherein the first switch control signal is controlled by a sense amplifier enabling signal, word line enabling block signal of the second memory block, and a refresh enabling signal, and
wherein the second switch control signal is controlled by the sense amplifier enabling signal, word line enabling block signal of the first memory block, and the refresh enabling signal.

9. A memory system comprising:
a memory module including the semiconductor memory device of claim 1 and one or more additional semiconductor memory devices, collectively comprising a plurality of semiconductor memory devices; and
a memory controller configured to generate command, address, and data signals,
wherein the memory module is configured to operate in response to the command, address, and data signals.

10. The memory system of claim 9, wherein each of the semiconductor memory devices is a dynamic random access memory (DRAM).

11. The memory system of claim 9, wherein the plurality of semiconductor memory devices are stacked on each other, and each of the semiconductor memory devices is configured to transmit and receive the data and the command/address signals through through-silicon vias (TSVs).

12. A semiconductor memory device comprising:
a first memory block including a plurality of word lines, each word line connected to a respective first row of memory cells;
a second memory block including a plurality of word lines, each word line connected to a respective second row of memory cells;
a first bit line connected to a first column of memory cells of the first memory block and connected to a first switch;
a second bit line connected to a second column of memory cells of the second memory block and connected to a second switch; and
a sense amplifier connected to the first and second switch, and configured to amplify data from one bit line selected between the first bit line and the second bit line when the semiconductor memory device performs a refresh operation,
wherein the semiconductor memory device is configured such that, when the first bit line is electrically connected to the sense amplifier:
the second switch electrically separates the second bit line from the sense amplifier such that the first bit line and the second bit line are not electrically connected to each other,
a first memory cell among the plurality of memory cells connected to the first bit line activates in response to a first word line signal applied to a first word line of the first memory block connected to the first memory cell, and
the first switch remains in an on state while the first word line remains activated.

13. The semiconductor memory device of claim 12, wherein the first switch is configured to turn off during a refresh operation of the second memory block, and
wherein the second switch is configured to turn off during a refresh operation of the first memory block.

14. The semiconductor memory device of claim 12, further comprising:
a first logic circuit configured to turn off the first switch in response to a refresh enabling signal, a word line enabling block signal of the second memory block, and a sense amplifier enabling signal;
a second logic circuit configured to turn off the second switch in response to the refresh enabling signal, a word line enabling block signal of the first memory block, and the sense amplifier enabling signal,
wherein the first and second switch are configured to turn on when the semiconductor memory device is not performing a refresh operation or when the sense amplifier is not performing a sensing operation.

15. A method of performing a refresh operation for a semiconductor memory device including a first switch having a first end connected to a first bit line connected to a plurality of memory cells of a first memory block and a second end connected to a bit line sense amplifier, a second switch having a first end connected to a second bit line connected to a plurality of memory cells of a second memory block and a second end connected to the bit line sense amplifier, and a first memory cell of the first memory block connected to the first bit line configured to activate in response to a first word line signal applied to a first word line connected to the first memory cell, the second bit line being a complementary bit line of the first bit line, the method comprising:

enabling the first word line;

enabling the bit line sense amplifier; and when refreshing the plurality of memory cells of the first memory block, enabling the first switch to electrically couple the first bit line to the bit line sense amplifier and disabling the second switch to electrically separate the second bit line from the bit line sense amplifier, wherein the first switch remains enabled while the first word line remains enabled.

16. The method of claim 15, further comprising:

when refreshing the plurality of memory cells of the second memory block, enabling the second switch to electrically couple the second bit line to the bit line sense amplifier and disabling the first switch to electrically separate the first bit line from the bit line sense amplifier.

17. The method of claim 15, wherein the disabling the first switch further comprises:

performing a NAND operation on a bit line sense amplifier enabling signal, a refresh enabling signal, and a word line enabling block signal of the second memory block.

18. The method of claim 15, wherein the disabling the second switch further comprises:

performing a NAND operation on a bit line sense amplifier enabling signal, a refresh enabling signal, and a word line enabling block signal of the first memory block.

19. The method of claim 15, further comprising:

performing a charge sharing on memory cells connected with a selected word line.

20. The method of claim 15, further comprising:

enabling the second switch after refreshing the selected memory cell of the first memory block.

* * * * *